US012640350B2

(12) United States Patent
Chou et al.

(10) Patent No.: US 12,640,350 B2
(45) Date of Patent: May 26, 2026

(54) SEMICONDUCTOR APPARATUS FOR DEPOSITION PROCESS

(71) Applicant: Taiwan Semiconductor Manufacturing Company, Ltd., Hsinchu (TW)

(72) Inventors: Chih-Wei Chou, Hsinchu (TW); Sheng-Yuan Lin, Hsinchu (TW); Yuan-Hsin Chi, Taichung (TW); Yin-Tun Chou, Hsinchu (TW); Hung-Chih Wang, Hsinchu (TW); Yu-Chi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 308 days.

(21) Appl. No.: 17/460,318

(22) Filed: Aug. 30, 2021

(65) Prior Publication Data

US 2023/0065818 A1     Mar. 2, 2023

(51) Int. Cl.
*H01J 37/32* (2006.01)
*C23C 16/455* (2006.01)
(Continued)

(52) U.S. Cl.
CPC .. *H01J 37/32642* (2013.01); *C23C 16/45565* (2013.01); *C23C 16/4583* (2013.01); (Continued)

(58) Field of Classification Search
CPC .......... C23C 16/45565; C23C 16/4583; C23C 16/46; C23C 16/50; H01J 37/32642; (Continued)

(56) References Cited

U.S. PATENT DOCUMENTS 6,074,514 A * 6/2000 Bjorkman ......... H01J 37/32871
156/345.35
6,079,356 A * 6/2000 Umotoy ............ H01J 37/32449
118/728

(Continued)

OTHER PUBLICATIONS

"Office Action of Taiwan Counterpart Application", issued on Jan. 17, 2025, p. 1-p. 6.

*Primary Examiner* — Charlee J. C. Bennett
(74) *Attorney, Agent, or Firm* — JCIPRNET

(57) ABSTRACT
An apparatus for performing a deposition process on a semiconductor wafer includes a chamber, a wafer holder, and a shielding structure. The chamber contains a reaction area, the wafer holder is disposed in the chamber to hold the semiconductor wafer, and the reaction area is above the semiconductor wafer. The shielding structure is disposed in the chamber and isolates an inner sidewall of the chamber from the reaction area. The shielding structure includes a base member, a first member, and a second member. The base member is disposed between the inner sidewall of the chamber and the wafer holder. The first member is disposed on the base member and is windowless. The second member is disposed on the base member and within the first member, and the second member includes a sidewall provided with a first window to transfer the semiconductor wafer.

20 Claims, 9 Drawing Sheets

(51) Int. Cl.
    *C23C 16/458*        (2006.01)
    *C23C 16/46*         (2006.01)
    *C23C 16/50*         (2006.01)

(52) U.S. Cl.
    CPC ............. *C23C 16/46* (2013.01); *C23C 16/50*
        (2013.01); *H01J 37/32724* (2013.01); *H01J*
        *2237/3321* (2013.01)

(58) Field of Classification Search
    CPC ......... H01J 37/32724; H01J 2237/3321; H01J
        37/32853; H01J 37/32871; H01J 37/3288;
        H01J 2237/332–3348
    USPC .......... 118/723, 715–733; 156/345.1–345.55
    See application file for complete search history.

(56)           References Cited

U.S. PATENT DOCUMENTS

| | | | | |
|---|---|---|---|---|
| 6,129,808 | A * | 10/2000 | Wicker | H01J 37/321 |
| | | | | 156/914 |
| 6,827,815 | B2 * | 12/2004 | Hytros | C23C 16/45565 |
| | | | | 156/345.32 |
| 10,954,596 | B2 * | 3/2021 | Polyak | C01F 7/141 |
| 11,236,424 | B2 * | 2/2022 | Mustafa | C23C 16/4401 |
| 2001/0004478 | A1 * | 6/2001 | Zhao | C23C 16/4412 |
| | | | | 427/535 |
| 2003/0132319 | A1 * | 7/2003 | Hytros | C23C 16/455 |
| | | | | 239/548 |
| 2007/0221294 | A1 | 9/2007 | Sasaki | |
| 2016/0181088 | A1 * | 6/2016 | Ghosh | C23C 16/4401 |
| | | | | 438/778 |
| 2016/0312359 | A1 * | 10/2016 | Dubois | H01J 37/32651 |
| 2019/0267220 | A1 | 8/2019 | Scheible et al. | |
| 2021/0020402 | A1 * | 1/2021 | Tang | H01J 37/3171 |

* cited by examiner

SEMICONDUCTOR APPARATUS FOR DEPOSITION PROCESS

BACKGROUND

During some semiconductor processes, wafers are processed by deposition. For example, a metal nitride layer may be formed by employing chemical vapor deposition (CVD) steps. In one example, between each of the deposition steps, the metal nitride layer is subjected to the plasma treatment to reduce contamination caused by the precursor gases used during the deposition process. Although existing apparatus for performing the deposition process has been generally adequate for its intended purposes, it has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
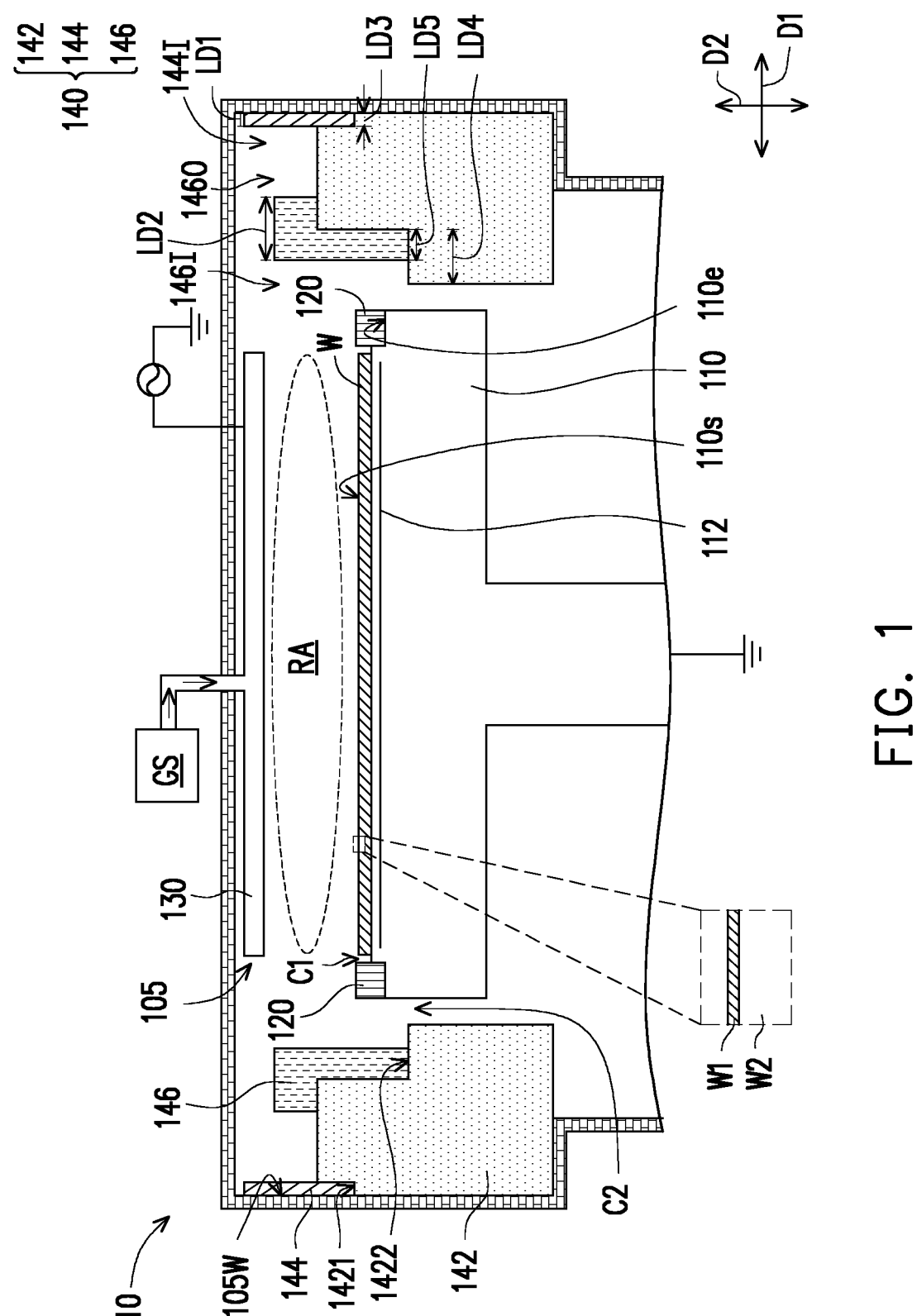
FIG. 1 is a schematic cross-sectional view of a semiconductor apparatus for processing a semiconductor wafer according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a chemical vapor deposition (CVD) processing chamber. Other embodiments may also be applied to other plasma assisted processes and apparatus.

FIG. 1 is a schematic cross-sectional view of a semiconductor apparatus for processing a semiconductor wafer according to some embodiments. Referring to FIG. 1, a semiconductor apparatus 10 is configured to perform a deposition process (e.g., CVD) on a semiconductor wafer W. It is noted that the semiconductor wafer W mentioned herein is not intended to be limited to any particular type. In some embodiments, a deposited layer W2 is formed on a base layer W1 through the deposition process. In some embodiments, the base layer W1 is a part of a semiconductor substrate such as a bulk semiconductor or the like, which may be doped or undoped. In some embodiments, the base layer W1 includes a semiconductor substrate having various features and layers formed thereon. In some embodiments, the deposited layer W2 is a metal nitride layer (e.g., titanium nitride) which serves as a glue layer or a barrier layer. For example, the deposited layer W2 is a part of interconnects in an integrated circuit structure. Alternatively, the deposited layer W2 may be or may include other metallic thin film (e.g., a titanium layer, a tantalum layer, or a tantalum nitride layer, etc.) or dielectric thin film (e.g., an oxide, an oxynitride, a nitride, etc.).

In some embodiments, forming the deposited layer W2 includes at least the following steps. At least one reactant gas may be introduced into a chamber to perform the CVD process, where the chamber may be in a vacuum condition. Next, a thin film having good step coverage is deposited on the base layer W1 by deposition through the reactant gas. In some embodiments, the reactant gas includes, but is not limited to, TDMAT, $TiCl_4$, TDEAT, and/or the like. Depending on the desired layer to be deposited, the reactant gas may include a metal-halogen gas, a metal-organic gas, combinations thereof, and/or the like. Subsequently, a plasma treatment may be performed to tune the density of the thin film to form the deposited layer W2 with high density. For example, the plasma treatment is performed to reduce impurities (e.g., carbon, oxygen, hydrogen, etc.) introduced into the thin film during the deposition process. In some embodiments, the reactant gas is stopped flowing into the chamber prior to the plasma treatment. In some embodiments, the plasma treatment includes bombarding the thin film with plasma formed from the at least one carrier gas. For example, the carrier gas for plasma treatment uses a mixture of nitrogen and hydrogen gas. Although other carrier gas may be employed for the plasma treatment.

The steps described above may be performed by various techniques, means, apparatus, and/or systems. The semiconductor apparatus 10 adapted for forming the deposited layer W2 is set forth in the accompanying drawings and the descriptions below. It should be noted that the drawings may not depict all of the components of the semiconductor apparatus 10 for ease of illustration and description.

With reference to FIG. 1, the semiconductor apparatus 10 may include a chamber 105 and a wafer holder 110 disposed within the chamber 105. For example, the semiconductor wafer W to be processed is placed on a carrying surface 110s of the wafer holder 110. The wafer holder 110 may be or may include a heating mechanism 112 that is configured to heat the semiconductor wafer W to be processed to a process temperature. The heating mechanism 112 is a heater, for example. In some embodiments, the wafer holder 110 is viewed as the heating assembly. In some embodiments, the wafer holder 110 is equipped with a moving mechanism (e.g., M1 labeled in FIG. 3) for moving the semiconductor wafer W. For example, the wafer holder 110 is configured to raise the semiconductor wafer W upwardly during processing and lower the semiconductor wafer W downwardly at the end of the process. The details of the moving mechanism will be described later in accompanying with FIGS. 3 and 8. Alternatively, the wafer holder 110 may be configured to perform other movement (e.g., translation, tilting, etc.) using any suitable means depending on process requirements.

In some embodiments, the semiconductor apparatus 10 includes a protective member 120 disposed on a periphery of the wafer holder 110 and surrounding the carrying surface 110s where the semiconductor wafer W is disposed on. In some embodiments, the protective member 120 is not in physical contact with the semiconductor wafer W and may be spatially apart from the semiconductor wafer W. For example, a clearance C1 is between the protective member 120 and the semiconductor wafer W, and the clearance C1 is non-zero. For example, the protective member 120 is of annular form and covers the edge 110e of the wafer holder 110 for protecting the edge 110e from deposition. The protective member 120 extending along the perimeter of the wafer holder 110 may be referred to as an edge ring. The protective member 120 may include any suitable material that can withstand the chemistries and thermal energy involved in the process. In some embodiments, the protective member 120 is provided as a multi-layered ring assembly including a major ring and at least one auxiliary ring covered by the major ring. In some embodiments, gaps may be formed between the major ring and the auxiliary rings. For example, the major ring may be made of aluminum or other suitable conductive material(s), and the auxiliary rings may be made of conductive or insulating material(s). The auxiliary rings may be configured to facilitate heat dissipation of the protective member 120, so that the temperature of the protective member 120 may be lower than the temperature on the semiconductor wafer during the process, thereby minimizing deposition on the ring assembly. The protective member 120 may include other suitable component(s) depending on the process and design requirements.

The semiconductor apparatus 10 may include a showerhead 130 located at the top of the chamber 105 and above the wafer holder 110 for introducing gases into the chamber 105. For example, the reaction area RA is formed between the showerhead 130 and the wafer holder 110 in the chamber 105. In some embodiments, at least one gas source GS is operably coupled to the chamber 105 to flow the reactant gas (or the carrier gas) into the chamber 105 through the showerhead 130. In some embodiments, the showerhead 130 may have a circular design with apertures (not shown) dispersed evenly around the showerhead 130 to allow for the dispersal of the gas into the chamber 105. The apertures of the showerhead 130 may various configuration(s) depending on the process requirements. In some embodiments, the showerhead 130 acts as the upper electrode and the wafer holder 110 acts as the lower electrode. For example, during the plasma treatment, the RF power may be applied to the upper electrode, while the lower electrode may be held at ground potential. For example, the wafer holder 110 is electrically grounded to the chamber 105 during the plasma treatment. Although other configuration(s) may be possible to perform the deposition and plasma treatment.

Still referring to FIG. 1, the semiconductor apparatus 10 may include a shielding structure 140 disposed inside the chamber 105 and around the wafer holder 110. The shielding structure 140 may be configured to shield an inner sidewall 105W of the chamber 105 for protection of chamber body and prevention from leakage. For example, the shielding structure 140 is configured to isolate the inner sidewall 105W of the chamber 105 from the reaction area RA. In some embodiments, the shielding structure 140 includes a base member 142, an outer member 144, and an inner member 146. For example, the base member 142 is disposed between the wafer holder 110 and the inner sidewall 105W of the chamber 105. In some embodiments, the base member 142 is physically abutted against the inner sidewall 105W of the chamber 105. Alternatively, the base member 142 may be spatially apart from the inner sidewall 105W of the chamber 105, and a gap (not shown) is formed between the outer sidewall of the base member and the inner sidewall of the chamber. In some embodiments, the clearance C2 is between the base member 142 and the wafer holder 110, where the clearance C2 is non-zero. In other words, the base member 142 may be spatially separated from the wafer holder 110 as well as the protective member 120 disposed on the wafer holder 110.

In some embodiments, the outer member 144 and the inner member 146 are disposed on and engaged with the base member 142. The outer member 144 may be disposed between the inner member 146 and the inner sidewall 105W of the chamber 105. In some embodiments, the outer member 144 is offset from the inner member 146 along a first direction D1 to laterally separate from the inner member 146. In some embodiments, the outer member 144 and the inner member 146 are offset in a second direction D2, so that the outer member 144 may accessibly expose at least a portion of the inner member 146. The second direction D2 may be substantially perpendicular to the first direction D1. For ease of description, and without intending the structures disclosed herein to be limited to any particular orientation, the first direction D1 may be referred to as the height-wise direction, and the second direction D2 may be referred to as the width-wise direction. In some embodiments, the outer member 144 is physically abutted against the inner sidewall 105W of the chamber 105. Alternatively, the outer member 144 may be spatially apart from the inner sidewall 105W of the chamber 105, and a gap is formed therebetween.

In some embodiments, the outer member 144 is thinner than the inner member 146. For example, a lateral dimension LD1 (e.g., width or thickness) of the outer member 144 is substantially less than a maximum lateral dimension (e.g., the top width) LD2 of the inner member 146. In some embodiments, the outer member 144 is disposed on an outer ledge 1421 of the base member 142 and the inner member 146 is disposed on an inner ledge 1422 of the base member 142. For example, a lateral dimension (e.g., width or thickness) LD3 of the outer ledge 1421 is substantially less than a lateral dimension LD3 of the inner ledge 1422. In some embodiments, the lateral dimension LD3 of the outer ledge 1421 is substantially equal to the lateral dimension LD1 of the outer member 144, so that the outer member 144 is substantially aligned with the base member 142. Alternatively, the lateral dimension LD3 of the outer ledge 1421 is greater than the lateral dimension LD1 of the outer member 144. In some embodiments, the lateral dimension LD3 of the inner ledge 1422 of the base member 142 is greater than the bottom width LD5 of the inner member 146. Alternatively, the bottom width LD5 and the lateral dimension LD3 may be substantially equal.

With continued reference to FIG. 1, the outer member 144 may be configured to isolate the inner sidewall 105W of the chamber 105 from the reaction area RA in order to avoid leakage (e.g., plasma leakage). In some embodiments, the inner member 146 confines the reaction area RA. In some embodiments, during plasma treatment, the inner member 146 is electrically floating. In some embodiments, the inner member 146 may be configured to confine the exhaust gas pumping channel, and the outer member 144 may be used to form the outer wall of the pumping channel. For example, a vacuum pump (not shown) is connected to the pumping channel to evacuate the exhaust gases from the chamber 105. In some embodiments, the vacuum pump is also utilized to control the pressure within the chamber 105 and evacuate materials from the chamber 105, as desired.

In some embodiments, the inner member 146 is an annular ring structure. The inner member 146 may have an L-shaped cross section, where the top width of the inner member 146 is greater than the bottom width of the inner member 146. In some embodiments, the outer member 144 may be an annular ring with a rectangular cross section. Although other shape(s) may be applicable depending on the design requirements. In some embodiments, the inner member 146 and the outer member 144 are made of the same material. For example, the inner member 146 and the outer member 144 are aluminum rings. In some embodiments, the base member 142 is made of a material different from the inner member 146 and the outer member 144. For example, the base member 142 is made of ceramic. Although the base member 142, the inner member 146, and the outer member 144 may be made of other material(s) and/or different shape(s) as long as the material(s) may withstand the chemistries and thermal energy involved in the process and the shape may properly shield the chamber body. The greater details of the shielding structure 140 will be described later in following figures.

Figure 2:
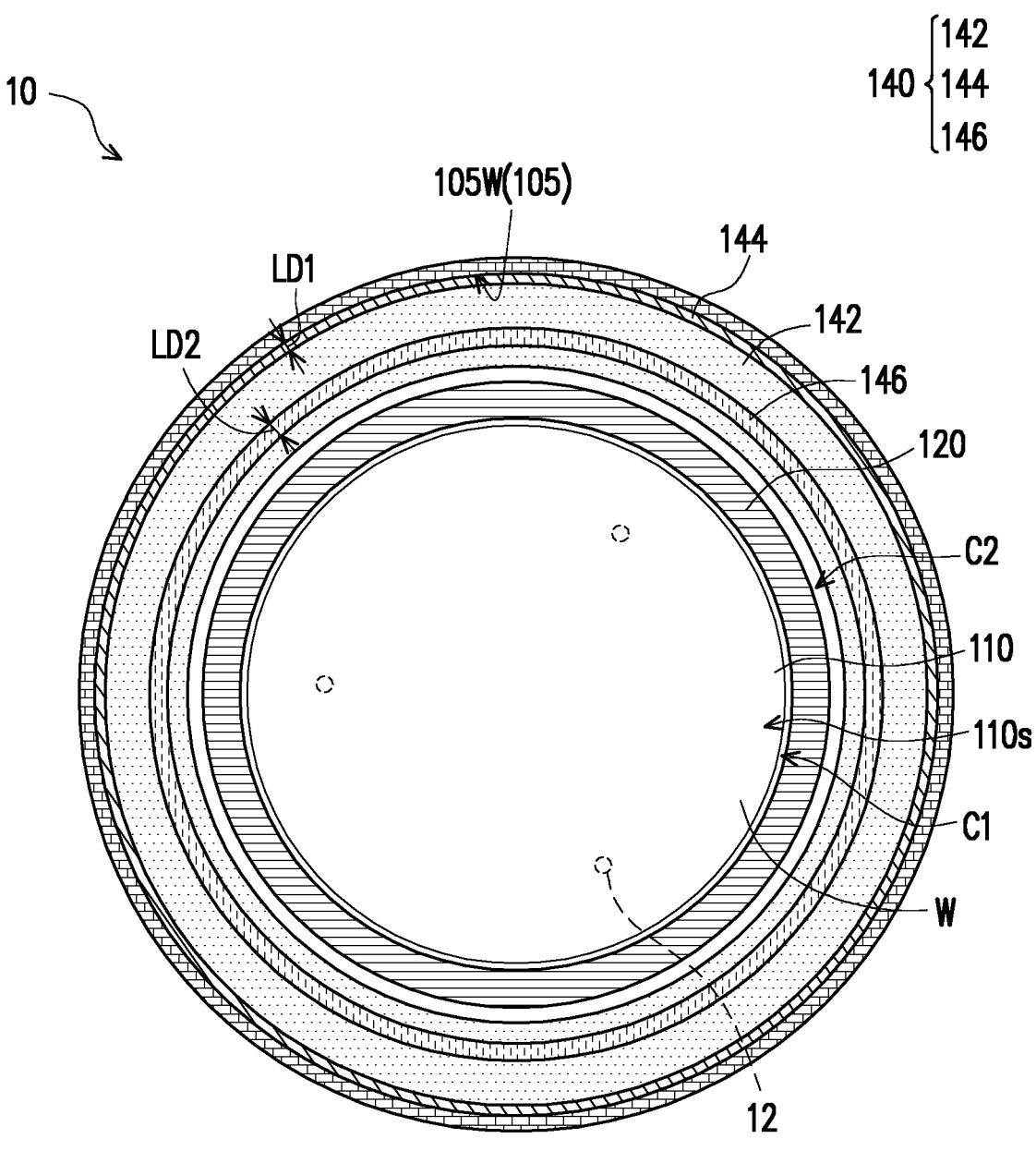
FIG. 2 is a schematic top-down view of a lower portion of a chamber of a semiconductor apparatus according to some embodiments.

FIG. 2 is a schematic top-down view of a lower portion of a chamber of a semiconductor apparatus according to some embodiments. For example, FIG. 2 shows the view of the semiconductor apparatus 10 seen from the top as the chamber is open (e.g., releasing the chamber lid). It should be noted that unless specified otherwise, like reference numbers are used to designate like elements throughout the drawings.

Referring to FIG. 2 and with reference to FIG. 1, the inner sidewall 105W of the chamber 105 is of annular form to encircle the shielding structure 140. For example, the base member 142 disposed within the inner sidewall 105W of the chamber 105 is of an annular shape as seen from the top view. The inner member 146 and the outer member 144 disposed on the base member 142 may not be in physical contact with each other. The outer member 144 may have the top thickness LD1 less than the top thickness LD2 of the inner member 146. For example, the outer member 144 disposed on the outer periphery of the base member 142 is of a ring proximate the inner sidewall 105W of the chamber 105. The inner member 146 disposed on the inner periphery of the base member 142 may also be of a ring shape, as seen from the top-down view. Given their placement on the base member 142 in the chamber 105, the outer member 144 may be viewed as the outer ring, and the inner member 146 may be viewed as the inner ring.

In some embodiments, the shielding structure 140 is not in physical in contact with the protective member 120 and the wafer holder 110. For example, the clearance C2 is between the protective member 120 and the base member 142. In some embodiments, the clearance C2 is a trench having a ring shape. In some embodiments, the carrying surface 110s of the wafer holder 110 is of a disk form. The protective member 120 disposed on the wafer holder 110 may be of an annular form, as seen from the top-down view. The semiconductor wafer W may be disposed on the carrying surface 110s of the wafer holder 110 without in physical contact with the protective member 120. For example, the clearance C1 is between the semiconductor wafer W and the protective member 120 and forms a trench having a ring shape.

In some embodiments, the wafer holder 110 is equipped with the moving mechanism (e.g., M1 labeled in FIG. 3) for moving the semiconductor wafer W. For example, the moving mechanism includes lift pins 12 disposed within receiving holes on the carrying surface 110s of the wafer holder 110. In some embodiments, the lift pins 12 are configured to lift the semiconductor wafer to be processed from a transferring mechanism (e.g., a robot blade; not shown) and release the semiconductor wafer to be processed on the carrying surface 110s of the wafer holder 110 for processing. In some embodiments, the lift pins 12 are configured to lower the semiconductor wafer that has been processed from the process positon to the transferring mechanism at the end of the process. It should be understood that the lift pins 12 are given for illustrative purposes, and various numbers, shapes, and configurations are within the contemplated scope of the disclosure.

Figure 3:
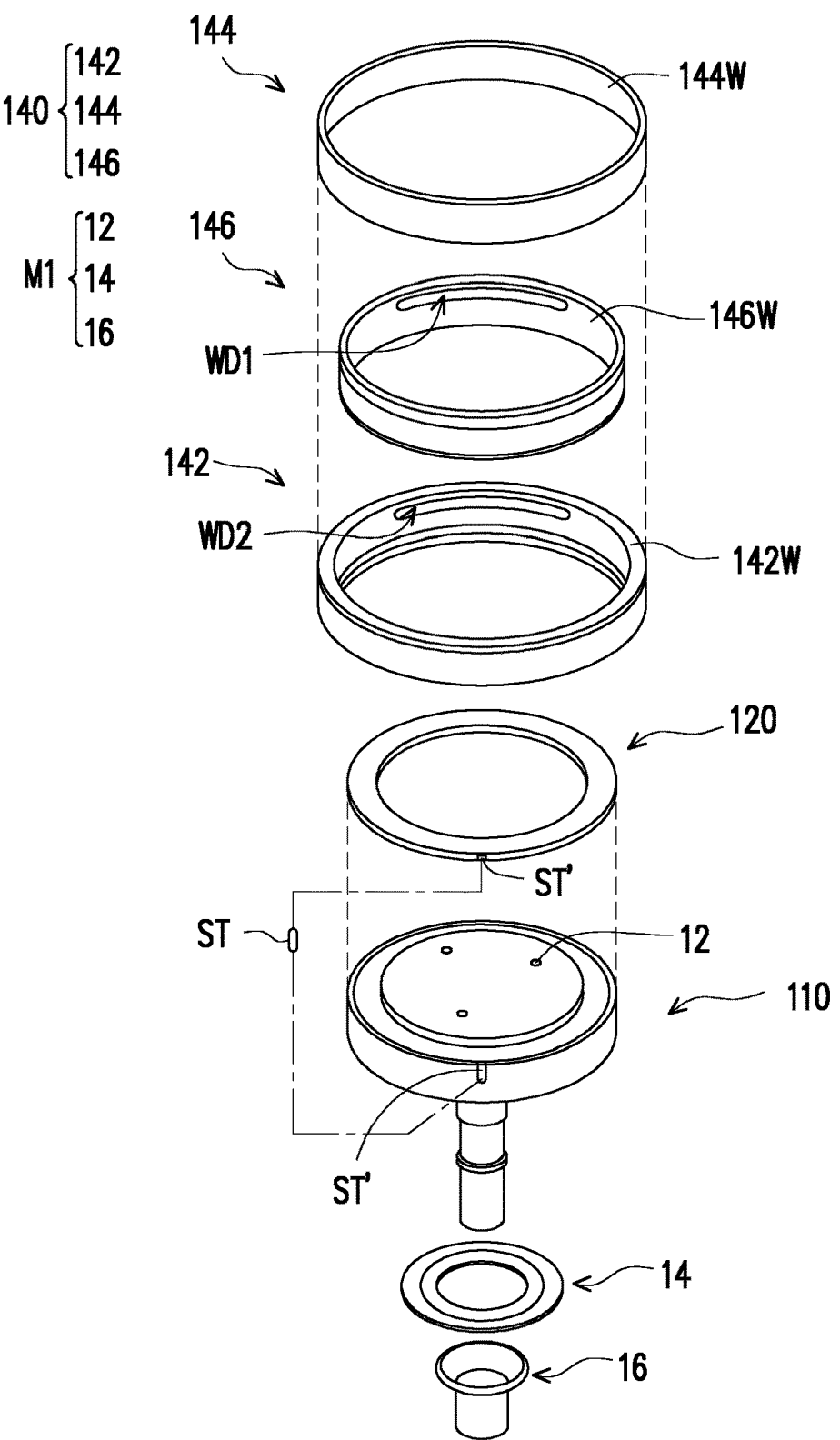
FIG. 3 is a schematic perspective and exploded view of various components of a semiconductor apparatus according to some embodiments.
Figure 4:
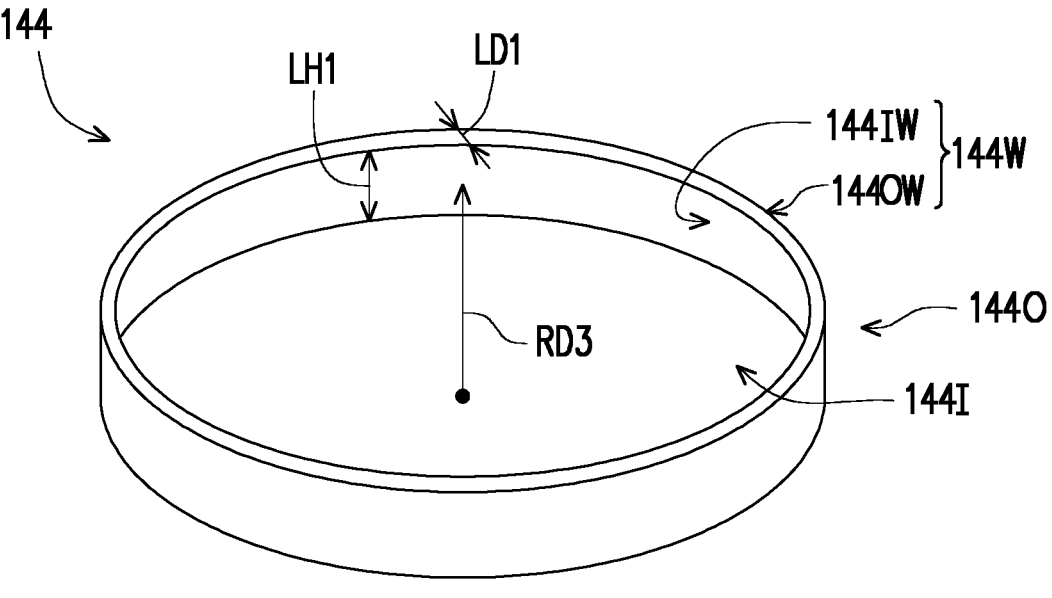
FIG. 4 is a schematic perspective and enlarged view of an outer member of a shielding structure according to some embodiments.
Figure 5:
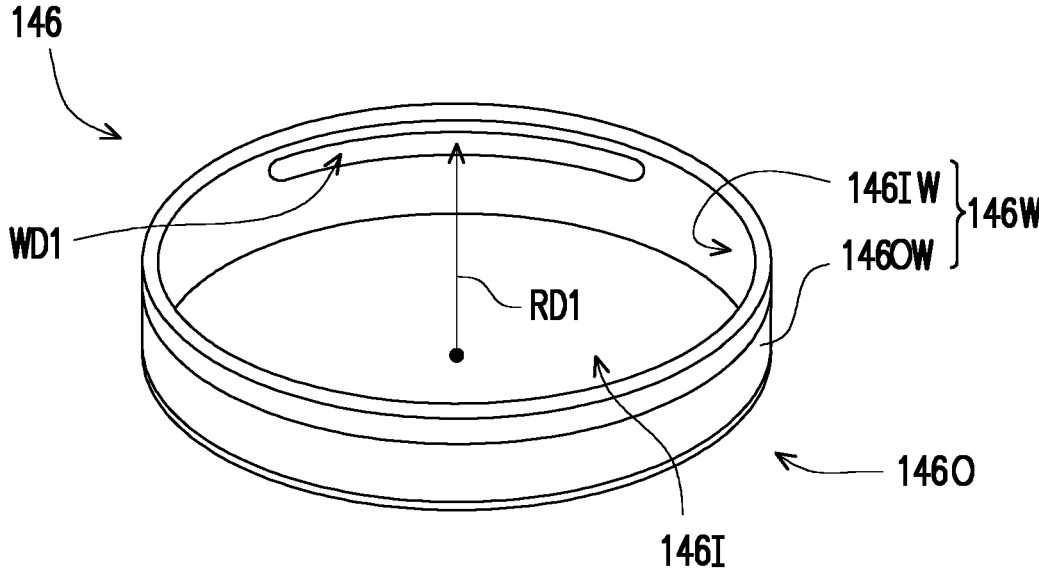
FIG. 5 is a schematic perspective and enlarged view of an inner member of a shielding structure according to some embodiments.
Figure 6:
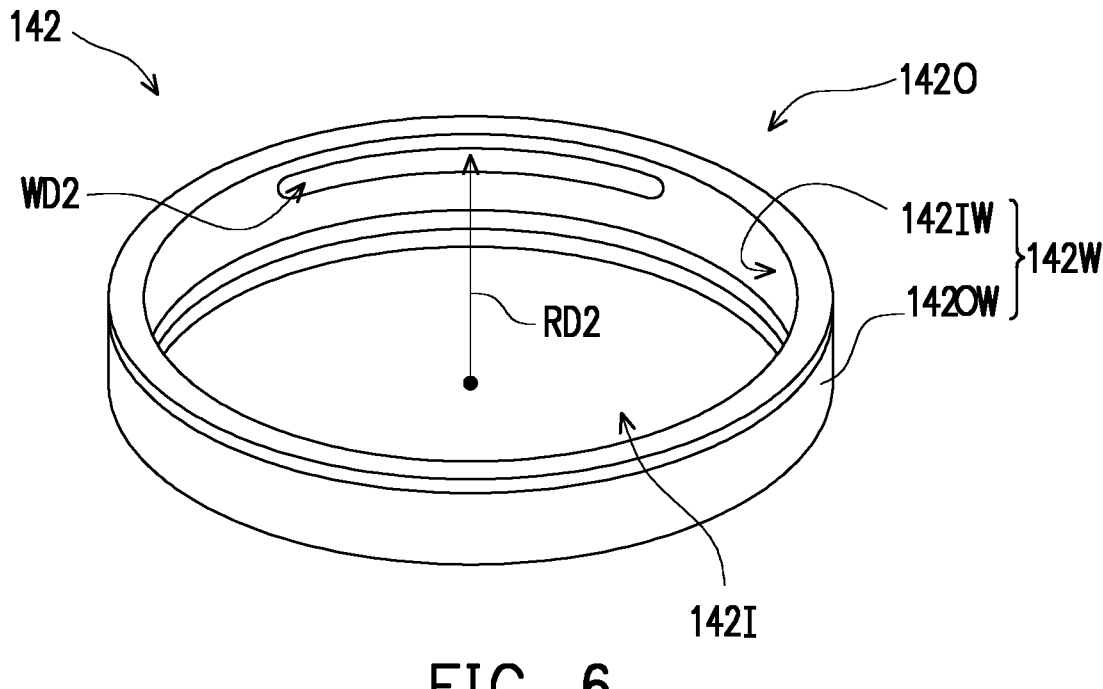
FIG. 6 is a schematic perspective and enlarged view of a base member of a shielding structure according to some embodiments.
Figure 7:
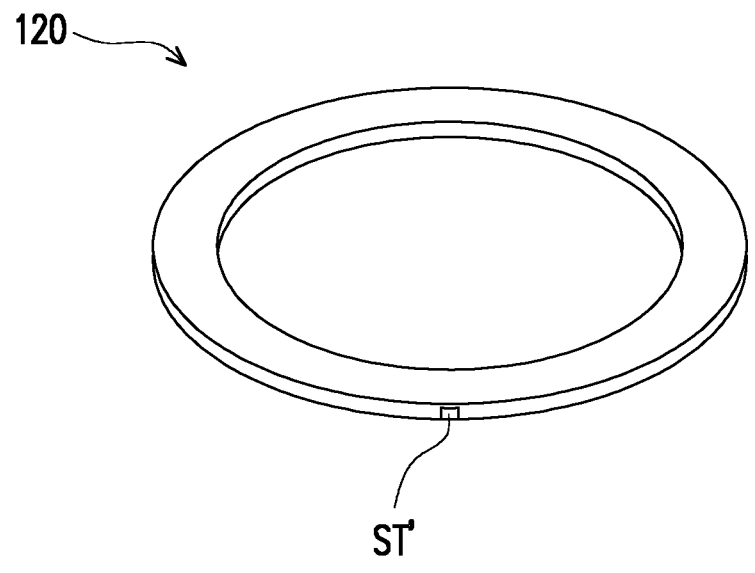
FIG. 7 is a schematic perspective and enlarged view of a protective member according to some embodiments.
Figure 8:
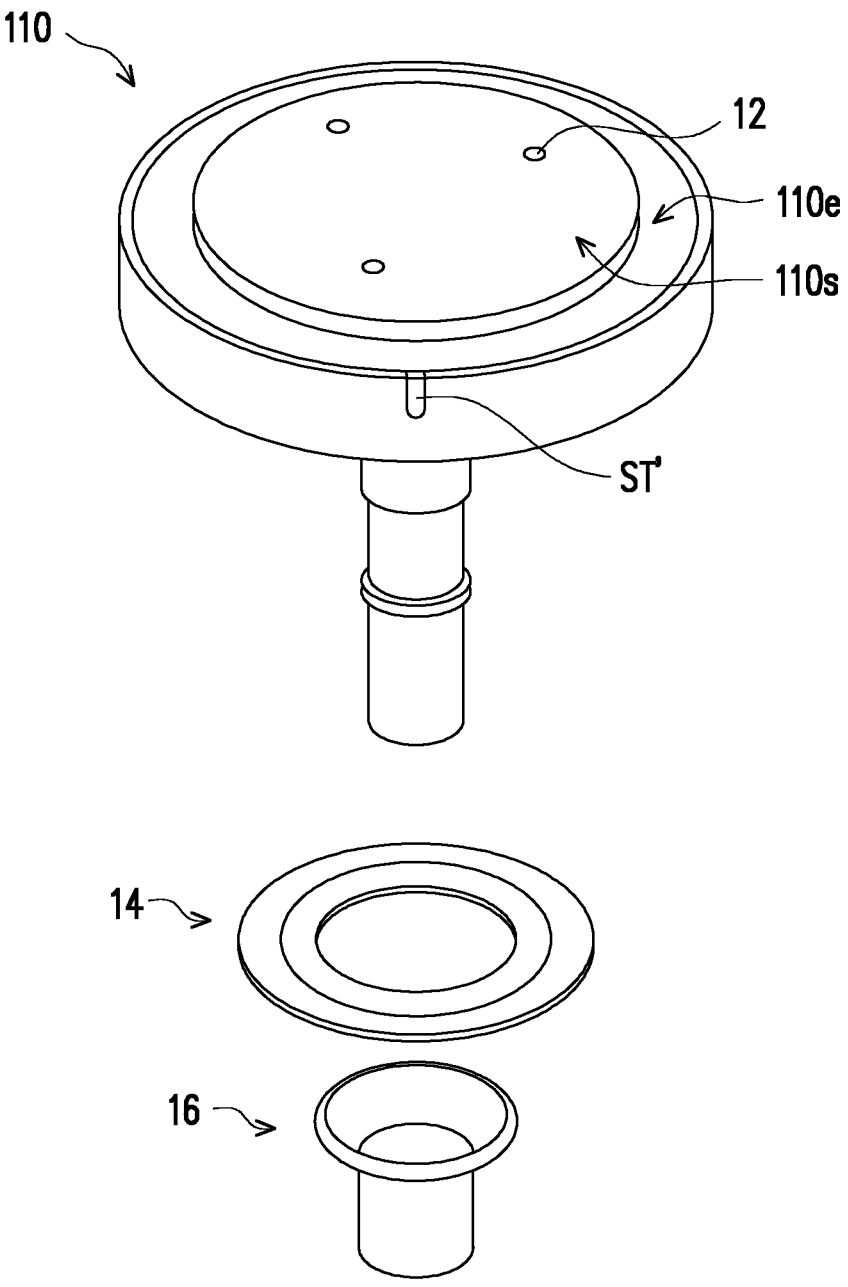
FIG. 8 is a schematic perspective and enlarged view of a wafer holder and a moving mechanism according to some embodiments.

FIG. 3 is a schematic perspective and exploded view of various components of a semiconductor apparatus according to some embodiments. For example, the shielding structure, the protective member, the wafer holder, and the moving mechanism are separately provided, and these components may be assembled together in the chamber. FIG. 4 is a schematic perspective and enlarged view of an outer member of a shielding structure, FIG. 5 is a schematic perspective and enlarged view of an inner member of a shielding structure, FIG. 6 is a schematic perspective and enlarged view of a base member of a shielding structure, FIG. 7 is a schematic perspective and enlarged view of a protective member, and FIG. 8 is a schematic perspective and enlarged view of a wafer holder and a moving mechanism according to some embodiments. It should be noted that unless specified otherwise, like reference numbers are used to designate like elements throughout the drawings.

Referring to FIGS. 3-6 and also with reference to FIGS. 1-2, the shielding structure 140 may include the base member 142, the outer member 144, and the inner member 146. In some embodiments, the base member 142, the outer member 144, and the inner member 146 are of an annular form. In some embodiments, the outermost perimeter of the base member 142 is substantially equal to the outer perimeter of the outer member 144. In some embodiments, as shown in FIG. 5, the inner member 146 includes the sidewall 146W defining the inner space 146I and the outer space 146O, and a window WD1 on the sidewall 146W to be in communication with the inner space 146I and the outer space 146O along the radial direction RD1 of the inner member 146. The sidewall 146W may include an inner surface 146IW facing the inner space 146I, the outer surface 146OW opposite to the inner surface 146IW, and the window WD1 connecting the inner space 146I with the outer space 146O. The window WD1 may be formed as an elongated slot for transferring the semiconductor wafer.

In some embodiments, the base member 142 is provided with the window WD2 corresponding to the window WD1 of the inner member 146. The window WD2 may have the shape and size similar to those of the window WD1 for transferring the semiconductor wafer. For example, as shown in FIG. 6, the base member 142 includes the sidewall 142W defining the inner space 142I and the outer space 142O, and the window WD2 on the sidewall 142W to be in communication with the inner space 142I and the outer space 142O along the radial direction RD2 of the base member 142. The sidewall 142W may include an inner surface 142IW facing the inner space 142I, the outer surface 142OW opposite to the inner surface 142IW, and the window WD2 connecting the inner space 142I with the outer space 142O. For example, the window WD2 of the base member 142 and the window WD1 of the inner member 146 are aligned and in communication with each other to serve as the wafer-transferring slot through which the semiconductor wafer W is transferred inside/out of the chamber 105.

With continued reference to FIGS. 1 and 3-6, in some embodiments, the outer member 144 has the sidewall 144W that is windowless. For example, as shown in FIG. 4, the sidewall 144W is the closed sidewall that defines the inner space 144I and the outer space 144O, and the inner space 144I and the outer space 144O are not in communication with each other along any radial direction RD3 of the outer member 144. As shown in the cross-sectional view of FIG. 1, the outer member 144 and the inner member 146 may be offset height-wise and width-wise relative to each other. The outer member 144 may accessibly expose the window WD1 of the inner member 146 and the window WD2 of the base member 142 after assembled together (e.g., shown in FIG. 12). In some embodiments, the outer member 144 is designed with optimal dimensions to fit in the gap between the inner sidewall 105W of the chamber 105 and the base member 142. For example, the thickness LD1 of the outer member 144 is in a range of about 2.5 mm and about 5 mm. The outer member 144 may be designed with an optimal height so that the outer member 144 may not interfere with the lid of the chamber after closing the lid. For example, the height LH1 of the outer member 144 ranges from about 23.5 mm to about 28.0 mm. It should be appreciated that these values of the thickness and the height are provided as examples and may vary depending on chamber design and process requirements.

In some embodiments, by configuring the outer member 144 to be windowless, the outer member 144 may not deform during the process. It had been observed that when the outer member is provided with a window (e.g., a view port) on the sidewall, particles or contaminants may be accumulated on the frame of the window of the outer member, which may cause contamination in the chamber. Moreover, it had been observed that when the outer member is provided with the window, deformation of the outer member occurs and may cause the chamber wall to be arcing. This may result in discharge conditions of the plasma to change, which may generate high-frequency reflected waves. The plasma in the chamber may become unstable to properly perform the aimed plasma treatment, which adversely affects the yield. In the illustrative embodiments, the outer member 144 is free of window/slot to avoid deformation during the process, thereby eliminating the issue of chamber arcing caused by the deformation of the outer member. The height of the outer member 144 may be designed to prevent the outer member 144 from interfering with the chamber lid. The thickness of the outer member 144 may be thick enough so that deformation will not occur when cleaning the outer member 144. The roundness of the outer member 144 may be remained substantially the same before and after the cleaning.

Still referring to FIG. 3 and with reference to FIGS. 1 and 7-8, the protective member 120 may be of as the annular form. The wafer holder 110 may have the edges 110e lower than the carrying surface 110s. For example, the wafer holder 110 includes a peripheral recess on which the protective member 120 is disposed, as shown in FIG. 1. In some embodiments, the outermost perimeter of the wafer holder 110 may be substantially equal to the outer perimeter of the protective member 120. Alternatively, the outer perimeter of the protective member 120 is substantially greater than the outermost perimeter of the wafer holder 110. In some embodiments, a strap ST is provided and configured to firmly connecting the protective member 120 and the wafer holder 110. For example, when installed, the strap ST is disposed within the receiving recesses ST' on the sidewalls of the protective member 120 and the wafer holder 110. For example, the combined contour of the recesses ST' of the protective member 120 and the wafer holder 110 and the contour of the strap ST are substantially complementary. The greater details will be described in accompanying with FIG. 9.

With continued reference to FIG. 3 and also referring to FIGS. 1 and 8, the wafer holder 110 may be equipped with the moving mechanism M1 for moving the semiconductor wafer W. For example, the lift pins 12 of the moving mechanism M1 are distributed on the carrying surface 110s of the wafer holder 110 and configured to perform reciprocating movements to raise and lower the semiconductor wafer W. The moving mechanism M1 may include an annular plate 14 and a tube 16 that are configured to support the lift pins 12 when lifting the semiconductor wafer W. It should be noted that the moving mechanism M1 may include more components (e.g., drivers, gears, shafts, actuators, etc.) or any suitable means to change the positon of the semiconductor wafer in the chamber, and the moving mechanism M1 shown herein is merely for illustrative purposes.

Figure 9:
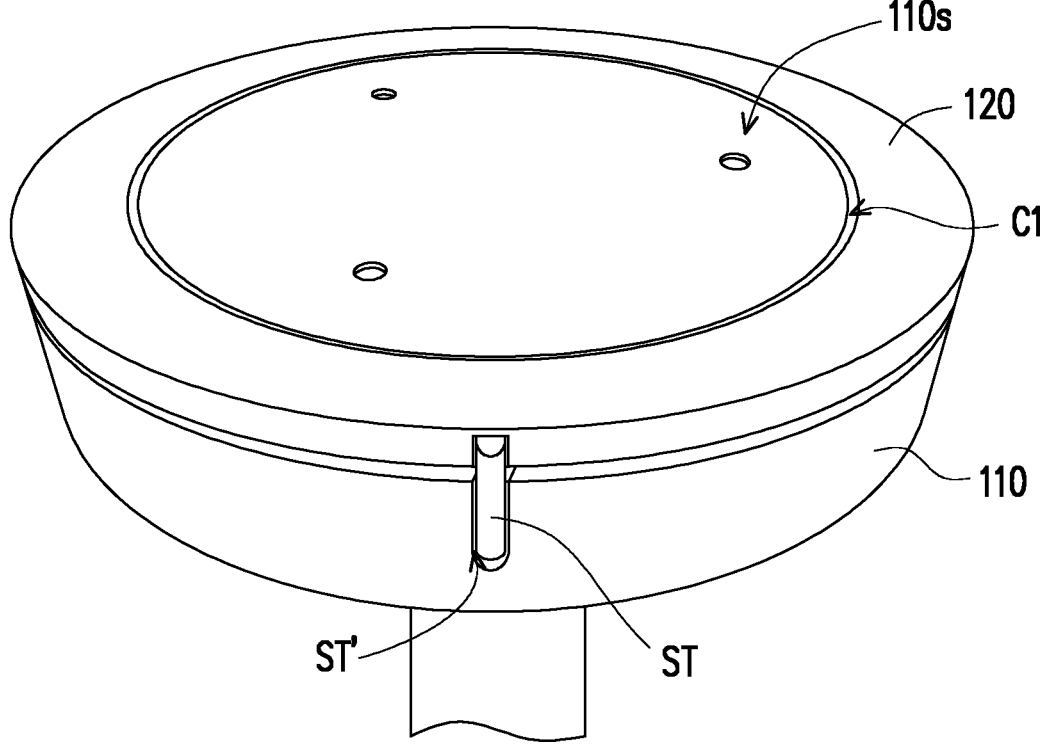
FIG. 9 is a schematic perspective and enlarged view showing a protective member attached to a wafer holder using a strap according to some embodiments.

FIG. 9 is a schematic perspective and enlarged view showing a protective member attached to a wafer holder using a strap according to some embodiments. It should be noted that unless specified otherwise, like reference numbers are used to designate like elements throughout the drawings.

Referring to FIG. 9 and with reference to FIGS. 3 and 8, the protective member 120 is disposed on the wafer holder 110 and surrounds the carrying surface 110s of the wafer holder 110. The clearance C1 may be formed between the protective member 120 and the carrying surface 110s of the wafer holder 110. In some embodiments, the strap ST is disposed in the recesses ST' on the sidewalls of the protective member 120 and the wafer holder 110 and firmly attaches to the protective member 120 and the wafer holder 110. For example, the strap ST is disposed in a vertical manner and extends from the sidewall of the protective member 120 to the sidewall of the wafer holder 110. The strap ST may be engaged with the protective member 120 and the wafer holder 110 using any suitable securing means. For example, the strap ST is made of any suitable conductive material. In some embodiments, the strap ST is referred to as the RF strap. In some embodiments, during the operation, the strap ST is configured to facilitate keeping the protective member 120 at the heater potential, and the resistance between the protective member 120 and the wafer holder 110 may be kept at the desired value or range.

Figure 10:
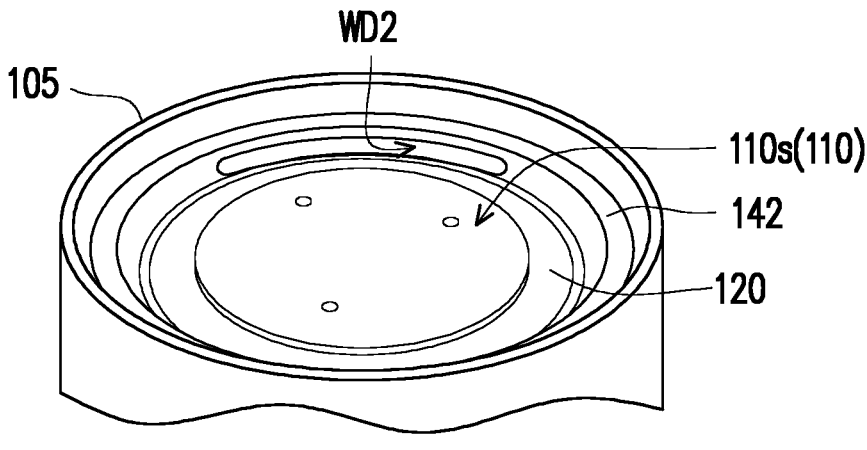
FIGS. 10-12 are schematic perspective and partial view showing various stages of placing a shielding structure in a chamber according to some embodiments.
Figure 11:
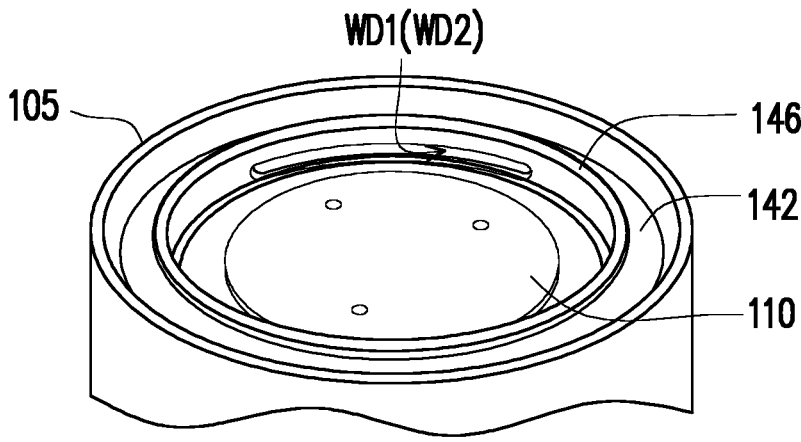
Figure 12:
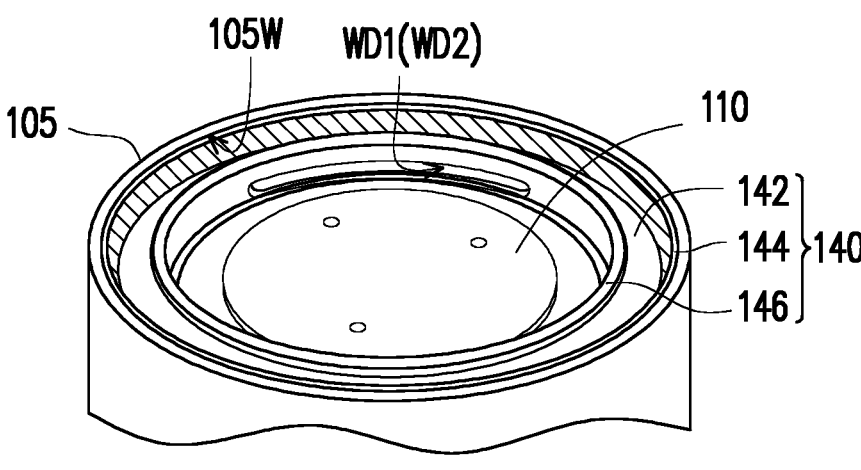

FIGS. 10-12 are schematic perspective and partial view showing various stages of placing a shielding structure in a chamber according to some embodiments. It should be noted that unless specified otherwise, like reference numbers are used to designate like elements throughout the drawings.

Referring to FIG. 10 and with reference to FIG. 3, the base member 142 may be disposed in the chamber 105. In some embodiments, the protective member 120 is mounted on the wafer holder 110 prior to the placement of the base member 142. In some embodiments, the window WD2 of the base member 142 is aligned with a transferring port (not labeled) of the chamber 105 for transferring the semiconductor wafer into/out of the chamber 105. In some embodiments, the window WD2 of the base member 142 may also correspond to the carrying surface 110s of the wafer holder 110 for placing the semiconductor wafer on the carrying surface 110s of the wafer holder 110.

Referring to FIG. 11 and with reference to FIG. 3, the inner member 146 may be subsequently placed on the base member 142. For example, the inner member 146 is engaged with the inner periphery of the base member 142. In some embodiments, the window WD1 of the inner member 146 is aligned with the window WD2 of the base member 142. The windows (WD1 and WD2) may form a transferring channel between the chamber 105 and the external environment for transferring the semiconductor wafer into/out of the chamber 105.

Referring to FIG. 12 and with reference to FIG. 3, the outer member 144 may be disposed on the base member 142 after placing the inner member 146. Alternatively, the sequence of placing the inner member 146 and placing the outer member 144 may be altered. For example, the placement of the outer member 144 is prior to the placement of the inner member 146. In some embodiments, the outer member 144 is engaged with the outer periphery of the base member 142 without blocking the transferring channel formed by the windows (WD1 and WD2). For example, the transferring channel is located underneath the outer member 144. In this manner, the outer member 144 does not interfere with transferring of the semiconductor wafer.

Figure 13:
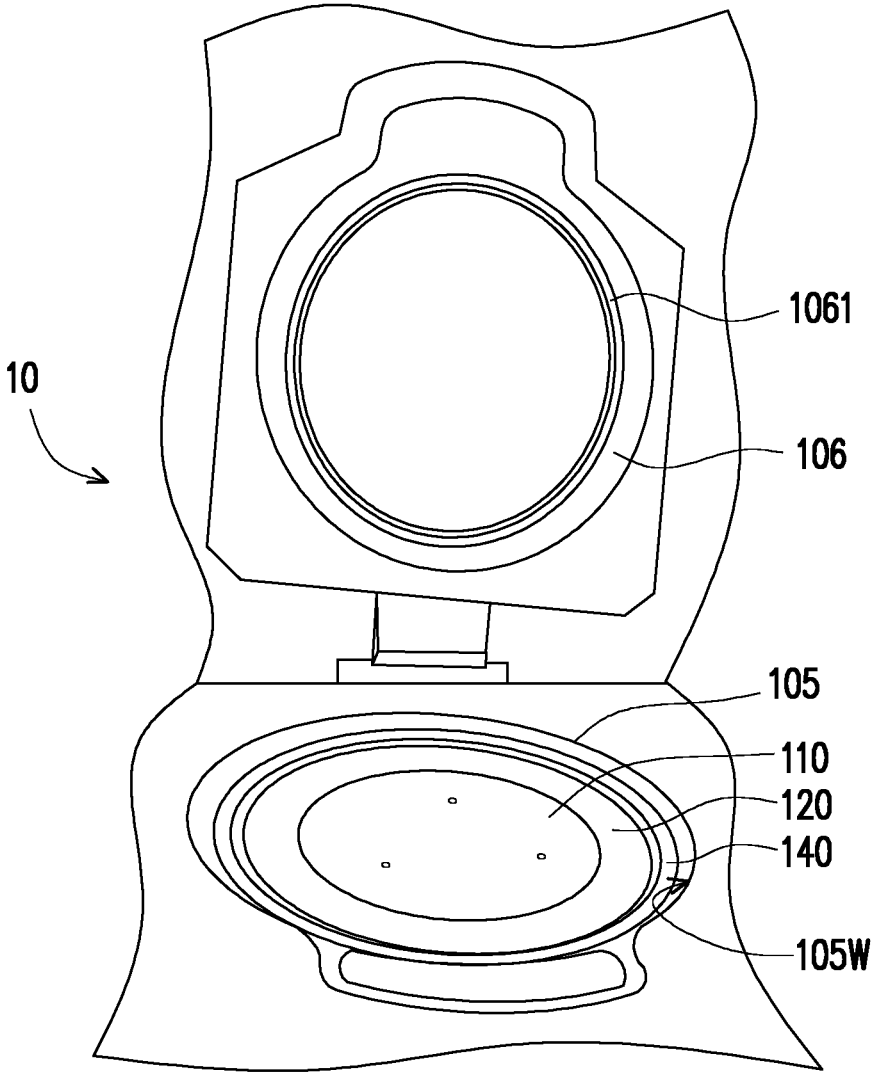
FIG. 13 is a schematic perspective view showing a chamber of a semiconductor apparatus after assembling according to some embodiments.

FIG. 13 is a schematic perspective view showing a chamber of a semiconductor apparatus after assembling according to some embodiments. It should be noted that the semiconductor apparatus in FIG. 13 is illustrated in a simplified manner. Unless specified otherwise, like reference numbers are used to designate like elements throughout the drawings.

Referring to FIG. 13 and with reference to FIG. 1, the semiconductor apparatus 10 including a chamber lid 106 and a chamber body 105 is provided. The chamber lid 106 may be pivotally coupled to the chamber body 105. In some embodiments, the showerhead is mounted on the chamber lid 106, and the wafer holder 110, the protective member 120, and the shielding structure 140 are assembled to the chamber body 105. The chamber lid 106 and the chamber body 105 may be made of material(s) such as steel, stainless steel, nickel, aluminum, alloys of these, combinations of these, or any suitable material that is inert to the various process materials. For example, when the chamber lid 106 is put down, the sealing member 1061 disposed on the chamber lid 106 contacts the chamber body 105 to form the confined space. In some embodiments, the sealing member 1061 is an O-ring, or other sealing or compressible member, that contacts the chamber body 105 to sufficiently create an airtight seal. Although the sealing member 1061 may be replaced with any suitable means that can form a sealed space when the chamber lid covers the chamber body.

In accordance with some embodiments, an apparatus for performing a deposition process on a semiconductor wafer includes a chamber, a wafer holder, and a shielding structure. The chamber contains a reaction area, the wafer holder is disposed in the chamber to hold the semiconductor wafer, and the reaction area is above the semiconductor wafer. The shielding structure is disposed in the chamber and isolates an inner sidewall of the chamber from the reaction area. The shielding structure includes a base member, a first member, and a second member. The base member is disposed between the inner sidewall of the chamber and the wafer holder. The first member is disposed on the base member and is windowless. The second member is disposed on the base member and within the first member, and the second member includes a sidewall provided with a first window to transfer the semiconductor wafer.

In accordance with some embodiments, an apparatus for performing a deposition process on a semiconductor wafer includes a chamber and a shielding structure disposed in the chamber. The chamber includes a reaction area above the semiconductor wafer, and the shielding structure isolates an inner sidewall of the chamber from the reaction area. The shielding structure includes a base member, an inner ring, and an outer ring. The base member includes a sidewall with a first window, and the sidewall of the base member is disposed around the inner sidewall of the chamber. The inner ring is disposed on the base member and includes a sidewall with a second window, and the first window of the base member is in communication with the second window of the inner ring to transfer the semiconductor wafer. The outer ring is disposed on the base member and is disposed between the inner sidewall of the chamber and the inner ring, and the outer ring includes a closed sidewall that is free of window.

In accordance with some embodiments, an apparatus for performing a deposition process on a semiconductor wafer includes a chamber, a wafer holder, and a shielding structure. The chamber includes a reaction area above the semiconductor wafer, and the wafer holder is disposed in the chamber and includes a carrying surface on which the semiconductor wafer is disposed. The shielding structure is disposed in the chamber and is disposed between an inner sidewall of the chamber and the wafer holder. The shielding structure includes an inner ring and an outer ring. The inner ring includes a first window and defines a first inner space and a first outer space, and the first window communicates the first outer space with the first inner space in a radial direction of the inner ring. The outer ring is disposed between the inner sidewall of the chamber and the inner ring, the outer ring defines a second inner space and a second outer space, and the outer ring includes a closed sidewall which blocks the second inner space from the second outer space in a radial direction of the outer ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for performing a deposition process on a semiconductor wafer, comprising:
   a chamber containing a reaction area;
   a wafer holder disposed in the chamber to hold the semiconductor wafer, the reaction area being over the semiconductor wafer; and
   a shielding structure disposed in the chamber and isolating an inner sidewall of the chamber from the reaction area, the shielding structure comprising:
      a base member disposed between the inner sidewall of the chamber and the wafer holder;
      a first member disposed on the base member and being windowless, wherein the first member is physically abutted against the inner sidewall of the chamber; and
      a second member disposed on the base member and within the first member, and the second member comprising a sidewall provided with a first window to transfer the semiconductor wafer, wherein the base member has an inner ledge protruding from an innermost sidewall of the second member, each of a first top surface and a second top surface of the base member is partially exposed by the second member and is partially covered by the second member, the second top surface of the base member is located at lower height than the first top surface of the base member, a sidewall of the base member is entirely covered by the second member, and the sidewall of the base member is connected with the first top surface and the second top surface of the base member.

2. The apparatus of claim 1, wherein the base member comprises a sidewall provided with a second window, and the first window of the second member being in communication with the second window of the base member to transfer the semiconductor wafer.

3. The apparatus of claim 1, wherein in a top view, a projection area of the second member is entirely located within a projection area of the base member, and the projection area of the second member is spaced apart from an innermost contour line of the projection area of the base member.

4. The apparatus of claim 1, wherein the first member and the second member are offset height-wise relative to each other, and the first window of the second member is accessibly exposed by the first member.

5. The apparatus of claim 1, wherein the first member has a thickness less than that of the second member.

6. The apparatus of claim 1, wherein the shielding structure is mounted on the chamber and spatially separated from the wafer holder.

7. The apparatus of claim 1, wherein the base member comprises an outer ledge, the first member is disposed on the outer ledge, and the second member is disposed on the inner ledge, a shortest distance between the wafer holder and the second member is greater than a shortest distance between the wafer holder and the inner ledge.

8. The apparatus of claim 7, wherein the outer ledge comprises a width less than that of the inner ledge.

9. The apparatus of claim 1, further comprising:
   a protective member disposed on a periphery of the wafer holder and surrounding a carrying surface of the wafer holder where the semiconductor wafer is disposed on.

10. The apparatus of claim 1, further comprising:
   a showerhead disposed above the wafer holder to generate a plasma in the reaction area, wherein the wafer holder comprises a heater to heat the semiconductor wafer placed thereon.

11. An apparatus for performing a deposition process on a semiconductor wafer, comprising:
   a chamber comprising a reaction area above the semiconductor wafer; and
   a shielding structure disposed in the chamber and isolating an inner sidewall of the chamber from the reaction area, the shielding structure comprising:
      a base member comprising a sidewall with a first window, the sidewall of the base member surrounded by the inner sidewall of the chamber;
      an inner ring disposed on the base member and comprising a sidewall with a second window, the first window of the base member being in communication with the second window of the inner ring to transfer the semiconductor wafer, wherein the base member has an inner ledge protruding from an innermost sidewall of the inner ring, each of a first top surface and a second top surface of the base member is partially exposed by the inner ring and partially covered by the inner ring, the second top surface of the base member is located at lower height than the first top surface of the base member, a sidewall of the base member is entirely covered by the inner ring, and the sidewall of the base member is connected with the first top surface and the second top surface of the base member; and
      an outer ring disposed on the base member and disposed between the inner sidewall of the chamber and the inner ring, the outer ring comprising a closed sidewall that is free of a window, wherein the outer ring is physically abutted against the inner sidewall of the chamber.

12. The apparatus of claim 11, wherein the outer ring and the inner ring are offset height-wise relative to each other, and the second window of the inner ring is accessibly exposed by the outer ring.

13. The apparatus of claim 11, wherein the outer ring is thinner than the inner ring.

14. The apparatus of claim 11, wherein the base member comprises an outer ledge, the outer ring is disposed on the outer ledge, and the inner ring is disposed on the inner ledge.

15. The apparatus of claim 11, further comprising:
   a wafer holder disposed in the chamber and carrying the semiconductor wafer, the wafer holder comprising a heating mechanism, and the shielding structure being spatially separated from the wafer holder.

16. The apparatus of claim 15, further comprising:
   a protective member disposed on a periphery of the wafer holder, the protective member being spatially separated from a carrying surface of the wafer holder on which the semiconductor wafer is disposed.

17. An apparatus for performing a deposition process on a semiconductor wafer, comprising:
   a chamber comprising a reaction area above the semiconductor wafer;

a wafer holder disposed in the chamber and comprising a
carrying surface on which the semiconductor wafer is
disposed; and a shielding structure disposed in the chamber and dis-
posed between an inner sidewall of the chamber and the
wafer holder, the shielding structure comprising:

an inner ring comprising a first window and defining a
first inner space and a first outer space, and the first
window communicating the first outer space with the
first inner space in a radial direction of the inner ring;

an outer ring disposed between the inner sidewall of the
chamber and the inner ring, the outer ring defining a
second inner space and a second outer space, and the
outer ring comprising a closed sidewall which blocks
the second inner space from the second outer space
in a radial direction of the outer ring, wherein the
outer ring is physically abutted against the inner
sidewall of the chamber; and a base member disposed between the wafer holder and
the inner sidewall of the chamber, wherein the base member has an inner ledge protruding from an
innermost sidewall of the inner ring, and wherein in
a top view, a projection area of the inner ring is
entirely located within a projection area of the base
member, and the projection area of the inner ring is
spaced apart from an innermost contour line of the
projection area of the base member.

18. The apparatus of claim 17, wherein
the inner ring is disposed on an inner periphery of the base
member, and the outer ring is disposed on an outer
periphery of the base member, and the inner ledge is
separated from the inner sidewall of the chamber.

19. The apparatus of claim 18, wherein the base member
comprises a second window that is in communication with
the first window of the inner ring.

20. The apparatus of claim 17, wherein the outer ring and
the inner ring are offset height-wise and width-wise relative
to each other.

* * * * *